US008597543B2

(12) United States Patent
Le Toquin

(10) Patent No.: US 8,597,543 B2
(45) Date of Patent: *Dec. 3, 2013

(54) CERIUM AND EUROPIUM DOPED PHOSPHOR COMPOSITIONS AND LIGHT EMITTING DEVICES INCLUDING THE SAME

(75) Inventor: Ronan P. Le Toquin, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/366,637

(22) Filed: Feb. 6, 2012

(65) Prior Publication Data

US 2012/0132857 A1  May 31, 2012

Related U.S. Application Data

(63) Continuation of application No. 12/250,828, filed on Oct. 14, 2008, now Pat. No. 8,119,028.

(60) Provisional application No. 60/987,817, filed on Nov. 14, 2007.

(51) Int. Cl.
*H01L 33/00* (2010.01)

(52) U.S. Cl.
USPC ............ 252/301.4 F; 252/301.4 R; 313/503; 257/98

(58) Field of Classification Search
USPC ......... 252/301.4 F, 301.4 R; 257/98; 313/503
See application file for complete search history.

(56) References Cited

U.S. PATENT DOCUMENTS

| | | | |
|---|---|---|---|
| 6,630,691 B1 * | 10/2003 | Mueller-Mach et al. ........ | 257/84 |
| 7,262,439 B2 * | 8/2007 | Setlur et al. .................... | 257/98 |
| 8,119,028 B2 * | 2/2012 | Le Toquin ............... | 252/301.4 F |
| 2005/0006659 A1 * | 1/2005 | Ng et al. ........................ | 257/99 |
| 2007/0114548 A1 | 5/2007 | Setlur et al. | |
| 2008/0283864 A1 * | 11/2008 | Le Toquin et al. ............. | 257/101 |

FOREIGN PATENT DOCUMENTS

| | | |
|---|---|---|
| EP | 1 696 016 A | 8/2006 |
| WO | WO 2006/094139 | 9/2006 |
| WO | WO 2006/095285 A1 | 9/2006 |
| WO | WO 2006/106948 A1 | 10/2006 |

OTHER PUBLICATIONS

European Communication, European Application No. 08 169 072.9-1218, dated Feb. 16, 2012, 11 pgs.
P. Schlotter, "Luminescence conversion of blue light emitting diodes", Applied Physics A, vol. 64, 1997, pp. 417-418, XP002528430.
R. Fischer, "Topics in Applied Physics: Amorphous Semiconductors", In: "Topics in Applied Physics", Jan. 1, 1985, Springer Berlin/Heidelberg, Berlin/Heidelberg, XP55018836, ISBN: 978-3-54-016008-3, pp. 159-187.
Chinese Second Office Action Corresponding to Chinese Patent Application No. 200810191196.1; Date of Issue: May 15, 2013; Foreign Text, 7 pages, English Translation Thereof, 9 pages.
European Office Action Corresponding to European Patent Application No. 12 165 900.7; Dated: May 7, 2013; 10 Pages.

* cited by examiner

*Primary Examiner* — Carol M Koslow
(74) *Attorney, Agent, or Firm* — Myers Bigel Sibley & Sajovec, P.A.

(57) ABSTRACT

Compounds of the following Formula may be useful as phosphors in solid state light emitting devices: $A_aB_bC_cD_dE_e$, wherein A includes calcium (Ca), strontium (Sr), barium (Ba), magnesium (Mg), yttrium (Y), hafnium (Hf), the lanthanide elements and/or the other alkaline earth (Group IIA) metals; B includes $Eu^{2+}$ and $Ce^{3+}$; C includes at least one tetrahedrally-coordinated trivalent element; D includes at least one tetrahedrally-coordinated tetravalent element; E includes N, O, F, C, S, Cl, Br and/or I, wherein a+b=1, c+d=2, and wherein the compound has a $CaAlSiN_3$-type crystal structure. Light emitting devices including such phosphors may emit warm white light.

19 Claims, 2 Drawing Sheets

CERIUM AND EUROPIUM DOPED PHOSPHOR COMPOSITIONS AND LIGHT EMITTING DEVICES INCLUDING THE SAME

RELATED APPLICATION

The present application is a continuation application of U.S. patent application Ser. No. 12/250,828 filed on Oct. 14, 2008, now U.S. Pat. No. 8,119,028, which claims the benefit of and priority to U.S. Provisional Patent Application No. 60/987,817, filed Nov. 14, 2007, entitled "CERIUM AND EUROPIUM DOPED PHOSPHOR COMPOSITIONS AND LIGHT EMITTING DEVICES INCLUDING THE SAME," the disclosures of which are hereby incorporated herein by reference in its entirety.

BACKGROUND

The present invention relates to phosphor materials and light emitting devices including the same. More particularly, the present invention relates to phosphor materials that may be useful in light emitting devices for producing warm white light.

Light emitting diodes and laser diodes are well known solid state lighting elements capable of generating light upon application of a sufficient voltage. Light emitting diodes and laser diodes may be generally referred to as light emitting devices ("LEDs"). LEDs generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device LEDs may be used in lighting/illumination applications, for example, as a replacement for conventional incandescent and/or fluorescent lighting. As such, it is often desirable to provide a lighting source that generates white light having a relatively high color rendering index (CRI), so that objects illuminated by the lighting may appear more natural. The color rendering index of a light source is an objective measure of the ability of the light generated by the source to accurately illuminate a broad range of colors. The color rendering index ranges from essentially zero for monochromatic sources to nearly 100 for incandescent sources.

In addition, the chromaticity of a particular light source may be referred to as the "color point" of the source. For a white light source, the chromaticity may be referred to as the "white point" of the source. The white point of a white light source may fall along a locus of chromaticity points corresponding to the color of light emitted by a black-body radiator heated to a given temperature. Accordingly, a white point may be identified by a correlated color temperature (CCT) of the light source, which is the temperature at which the heated black-body radiator matches the color or hue of the white light source. White light typically has a CCT of between about 4000 and 8000K. White light with a CCT of 4000 has a yellowish color. White light with a CCT of 8000K is more bluish in color, and may be referred to as "cool white". "Warm white" may be used to describe white light with a CCT of between about 2600K and 3500K, which is more reddish in color.

In order to produce white light, multiple LEDs emitting light of different colors of light may be used. The light emitted by the LEDs may be combined to produce a desired intensity and/or color of white light. For example, when red-, green- and blue-emitting LEDs are energized simultaneously, the resulting combined light may appear white, or nearly white, depending on the relative intensities of the component red, green and blue sources. However, in LED lamps including red, green, and blue LEDs, the spectral power distributions of the component LEDs may be relatively narrow (e.g., about 10-30 nm full width at half maximum (FWHM)). While it may be possible to achieve fairly high luminous efficacy and/or color rendering with such lamps, wavelength ranges may exist in which it may be difficult to obtain high efficiency (e.g., approximately 550 nm).

In addition, the light from a single-color LED may be converted to white light by surrounding the LED with a wavelength conversion material, such as phosphor particles. The term "phosphor" may be used herein to refer to any material that absorbs light at one wavelength and re-emits light at a different wavelength, regardless of the delay between absorption and re-emission and regardless of the wavelengths involved. Accordingly, the term "phosphor" may be used herein to refer to materials that are sometimes called fluorescent and/or phosphorescent. In general, phosphors absorb light having shorter wavelengths and re-emit light having longer wavelengths. As such, some or all of the light emitted by the LED at a first wavelength may be absorbed by the phosphor particles, which may responsively emit light at a second wavelength. For example, a single blue emitting LED may be surrounded with a yellow phosphor, such as cerium-doped yttrium aluminum garnet (YAG). The resulting light, which is a combination of blue light and yellow light, may appear white to an observer. However, the CRI of the light generated from a phosphor-based solid state light source may not be optimal. Thus, while light generated by such an arrangement may appear white, objects illuminated by such light may not appear to have desirable coloring due to the provided spectrum of the light. For example, as the light from a blue LED covered by a yellow phosphor may have little energy in the red portion of the visible spectrum, red colors in an object may not be well-illuminated. As a result, the object may appear to have an unnatural coloring when viewed under such a light source.

Accordingly, there is a continued need in the art for improved phosphor materials and for warm white LEDs including the same.

SUMMARY

According to some embodiments of the invention, provided are compounds of Formula I:

$$A_a B_b C_c D_d E_e \qquad (I)$$

wherein A includes calcium (Ca), strontium (Sr), barium (Ba), magnesium (Mg), yttrium (Y), hafnium (Hf), the lanthanide elements and/or the other alkaline earth (Group IIA) metals;

B includes $Eu^{2+}$ and $Ce^{3+}$;

C includes at least one tetrahedrally-coordinated trivalent element;

D includes at least one tetrahedrally-coordinated tetravalent element;

E includes N, O, F, C, S, Cl, Br and/or I, wherein a+b=1, c+d=2, and wherein the compound has a $CaAlSiN_3$-type crystal structure.

In particular embodiments of the invention, a is in a range of 0.7 to 1.3; b is in a range of 0.01 to 0.3, and in some embodiments, in a range of 0.05 to 0.2; c is in a range of 0.5 to 1.5; d is in a range of 0.5 to 1.5; and e is in a range of 2.5 to 3.5.

In addition, according to some embodiments, the compound of Formula I may be present as a powder having an average particle size of about 0.5 µm to about 30 µm.

According to some embodiments, the phosphor has a maximum emission wavelength in a range of 500 to 700 nm. The maximum emission wavelength may occur when the phosphor is irradiated with radiation at a wavelength in a range of about 380 nm to about 480 nm. Furthermore, in some embodiments, the full width at half maximum of the maximum emission spectrum may be in a range of about 120 nm to about 200 nm. Such a phosphor may have a conversion efficiency in a range of about 60 to about 100%.

Also provided according to embodiments of the invention are light emitting devices that include a phosphor, in some embodiments a compound of Formula I, and a light emitting element. The light emitting element may emit light at a wavelength in a range of about 380 nm to about 470 nm, according to embodiments of the invention, and the phosphor may absorb at least some of the light emitted from the light emitting element and may emit light with a maximum emission at a wavelength in a range of about 500 to about 700 nm, wherein the FWHM is in a range of about 120 to about 200 nm. Furthermore, the light produced by the light emitting device may have a CRI of at least 80 and may have a correlated color temperature in a range of about 2500 to about 4500K.

Light emitting devices according to some embodiments of the invention also include other elements, such as scattering layers, inert layers and/or emissive layers.

DETAILED DESCRIPTION

Figure 1:
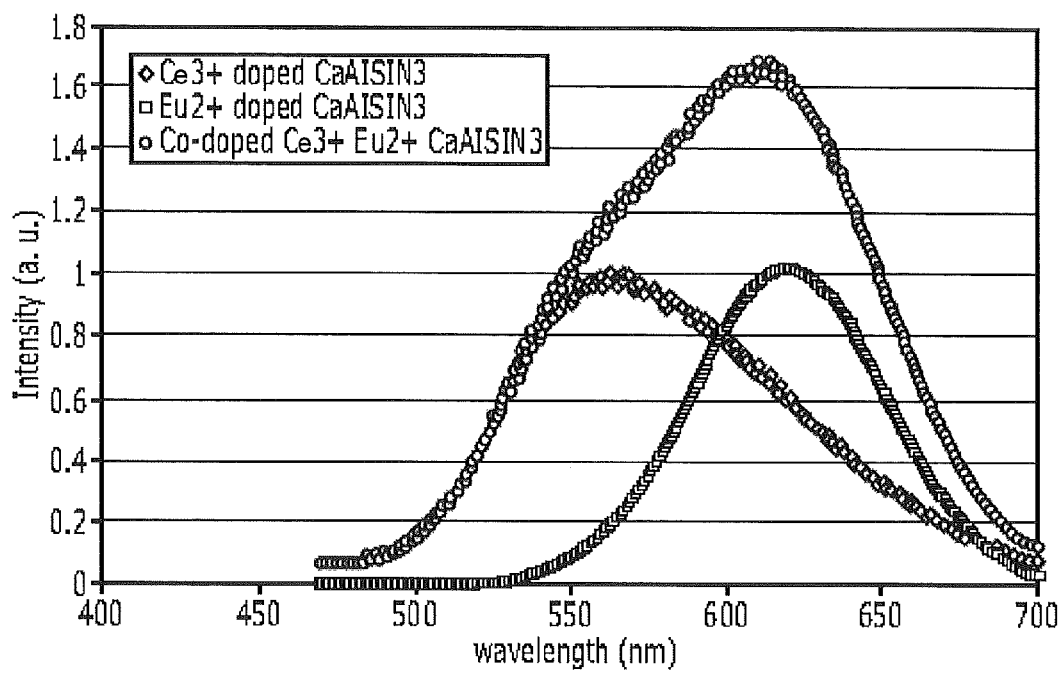
FIG. 1 depicts a simulated emission spectrum for (◇) $Ce^{3+}$ doped $CaAlSiN_3$, (☐)$Eu^{2+}$ doped $CaAlSiN_3$ and a (○) $Ce^{3+}$ and $Eu^{2+}$ co-doped $CaAlSiN_3$.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these teens. These teens are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

According to some embodiments of the present invention, provided are novel compounds that may be useful as phosphors. Specifically, some embodiments of the present invention provide phosphor materials that may be useful in warm white solid state light emitting devices.

As described above, it is known that a single blue emitting LED may be surrounded with a yellow phosphor, and that the combination of blue light and yellow light may appear white to an observer. Red-emitting phosphor particles may also be added to improve the color rendering properties of the light, i.e., to make the light appear more "warm". For example, yellow and red phosphors which typically have maximum emission wavelengths in the range of 520-580 nm and 590-640 nm, respectively, may be mixed in a slurry and deposited on a chip, or co-deposited via electrophoresis deposition. For example, European Patent Publication No. 1,696,016 describes that a $CaAlSiN_3$ phosphor doped with $Eu^{2+}$ may produce a red phosphor with an emission spectrum in a range of about 600 to about 640 nm. In addition, U.S. Patent Application Publication No. 2007/0075629 entitled Nitride and Oxy-Nitride Cerium Based Phosphor Materials For Solid-State Lighting Applications (Inventors: Ronan P. Le Toquin and Anthony K. Cheetham) describes that a $CaAlSiN_3$ phosphor doped with $Ce^{2+}$ may produce a yellow light with an emission spectrum in a range of about 500 to about 700 nm. Thus, for example, powders of the two aforementioned phosphors may be physically mixed and included in an LED in order to produce warm white light.

However, the mixture of yellow and red phosphor particles may also present challenges. Specifically, the conversion efficiency of the phosphors, which is determined based on the cumulative losses of the two phosphors, may be reduced compared to conversion efficiencies when only one type of phosphor is used. In addition, the excitation curve of the higher emission wavelength phosphor may be broad and may overlap with the emission curve of the lower emission wavelength phosphor, leading to re-absorption.

Provided herein are compounds that may be useful as phosphors and may reduce or eliminate some of the aforementioned challenges. In some embodiments of the present invention, provided are $CaAlSiN_3$ phosphors that are co-doped with both Europium in the +2 oxidation state ($Eu^{2+}$) and Cerium in the +3 oxidation state ($Ce^{3+}$). The co-doping of $CaAlSiN_3$ with both Ce and Eu emitters may provide phosphors with an emission band that can range from about 500 to about 700 nm, as illustrated by the simulated emission spectra provided in FIG. 1. In addition, substitutions of atoms in the $CaAlSiN_3$ crystal structure may be effectuated such that other inorganic compounds disclosed herein also produce light in a range of about 500 to about 700 nm, and so may produce warm white light when used in an LED that includes a blue emitting solid state die.

According to some embodiments of the invention, provided are compounds of Formula I:

$$A_aB_bC_cD_dE_e \qquad (I)$$

wherein A includes calcium (Ca), strontium (Sr), barium (Ba), magnesium (Mg), yttrium (Y), hafnium (Hf), the lanthanide elements and/or the alkaline earth (Group II) metals;

B includes $Eu^{2+}$ and $Ce^{3+}$;

C includes at least one tetrahedrally-coordinated trivalent element;

D includes at least one tetrahedrally-coordinated tetravalent element;

E includes N, O, F, C, S, Cl, Br and/or I, wherein a+b=1, c+d=2, and wherein the compound has a $CaAlSiN_3$-type crystal structure.

In some embodiments of the invention, a is in a range of 0.7 to 1.3; b is in a range of 0.01 to 0.3, and in some embodiments, in a range of 0.05 to 0.2; c is in a range of 0.5 to 1.5; d is in a range of 0.5 to 1.5; and e is in a range of 2.5 to 3.5.

In particular embodiments, the elements in each group A, B, C, D and/or E may be selected from a more specific group of elements. For example, according to some embodiments of the invention, A may include Mg, Ba, Sr and/or Ca, and in particular embodiments, A may include Ca. Furthermore, in particular embodiments, A may include Sr and Ca at a ratio such that the (mole fraction of Sr)+(mole fraction of Ca) is equal to 1, or $\chi(Sr)+\chi(Ca)=1$. As an additional example, in some embodiments of the invention, C may include Al, B, Ga, P, In, Sc, Y, Gd, and/or Lu and in particular embodiments, C may include Al. In yet another example, according to some embodiments of the invention, D may include Si, Ge, Sn, Ti, Zr and/or Hf, in some embodiments, D may include Si, and in particular embodiments, C may include Al and D may include Si, wherein c+d=2. In addition, in some embodiments, E may include N, C, S, Cl, Br, I and/or F, in some embodiments, E may include N, and in particular embodiments, E may include O and N at a ratio wherein the (mole fraction of O)+(mole fraction of N) is equal to 3, or $\chi(O)+\chi(N)=3$.

According to some embodiments of the invention, the phosphor material is $CaAlSiN_3$ doped with Eu and Ce at a concentration in a range of about 0.1 to about 20%, and in some embodiments, in a range of about 0.5 to about 20%.

As one of skill in the art will appreciate, the use of the phrase "$CaAlSiN_3$-type" is meant to refer to a crystal structure that has the same basic structure, coordination and lattice parameters as $CaAlSiN_3$, but wherein, in some embodiments, other elements can substitute into the sites of calcium, aluminum, silicon and/or nitrogen, such that, in Formula I, the elements of Groups A and B may substitute for calcium on its crystallographic site, the elements of Group C may substitute for the aluminum on its crystallographic lattice site, the elements of Group D may substitute for silicon on its crystallographic lattice site, and the elements of Group E may substitute for nitrogen on its crystallographic site. In some embodiments, the compound of Formula I crystallizes in the orthorhombic system with the $Cmc2_1$ space group, and with cell parameters in the order of a=9.80 Å, b=5.65 Å and c=5.06 Å.

The compounds of Formula I may be present as polycrystalline particles, and in some embodiments of the present invention, at least one compound of Formula I may be present as a powder having an average particle size in a range of about 0.5 µm to about 30 µm. In further embodiments, a compound of Formula I may be present as a single crystal material, and may be used, for example, be used in the light emitting devices described in U.S. Patent Application Publication No. 2008/0283864, filed May 16, 2007, entitled Single Crystal Light Conversion Structures For Light Emitting Devices (Inventors: Ronan P. Le Toquin, Nick Medendorp, Bernd Keller and Arpan Chakraborty), which is incorporated herein by reference in its entirety.

As described above, in some embodiments of the invention, the phosphor may have a maximum emission wavelength in a range of about 500 to about 700 nm. Furthermore, in some embodiments, the maximum emission wavelength occurs when the phosphor is irradiated with radiation at a wavelength in a range of about 380 nm to about 470 nm. In addition, in some embodiments, the FWHM of the maximum emission spectrum is less than about 200 nm.

Thus, when used with a blue emitting light source, the phosphors according to some embodiments of the invention may provide warm white light with relatively high CRI (e.g., >80), improved conversion efficiency (e.g., to a range of about 60% to about 100%) and reduced re-absorption. In addition, in embodiments of the invention, warm white light with a CCT in a range of 2500 to about 4500 K may be provided. Furthermore, such a phosphor material may provide manufacturing benefits, as only one type of phosphor is used, and so matching particle sizes between different phosphor materials is not necessary.

The phosphors provided according to embodiments of the invention may be synthesized by any suitable method. For example, in some embodiments, the metal elements, such as Ca, Sr, Al and/or Si, in stoichiometric amounts, may be weighed, mixed with a Ce and Eu source and ground in an inert atmosphere to minimize/prevent degradation, such as oxidation or hydrolysis. The mixture may then heated, e.g., to a temperature in a range of about 1450° C. and 1600° C. a nitrogen ($N_2$), nitrogen/hydrogen mixtures ($N_2/H_2$) and/or ammonia ($NH_3$) gas flow. In other embodiments, a similar procedure may be used, except that instead of the metals, metal nitrides, such as $Sr_2N$, $Ca_3N_2$, AlN, $Si_3N_4$, $Si_2N_2(NH)$, $Si_2N2O$ and $Si(NH)_2$, are used. Furthermore, in some embodiments, a mixture of metals and metal nitrides may be used.

In still other embodiments, a single crystal of a compound of Formula I may be formed by any suitable method. For example, in some embodiments, it may be formed by the Czochralski growth method. A Czochralski-type method is a method of producing large single crystals, or boules, by inserting a small seed crystal of an inorganic material into a crucible filled with similar molten material, then slowly pulling the seed up from the melt while rotating it. In some embodiments, the single crystal may be formed via single crystal thin film deposition techniques, such as MOCVD, MBE, and the like.

Also provided according to some embodiments of the invention are light emitting devices that includes at least one compound of Formula I; and a light emitting source.

The light emitting source may include a light emitting diode, a laser diode and/or other semiconductor device that includes one or more semiconductor layers, which may include silicon, silicon carbide, gallium nitride and/or other semiconductor materials, a substrate which may include sapphire, silicon, silicon carbide and/or other microelectronic substrates, and one or more contact layers, which may include metal and/or other conductive layers. The design and fabrication of semiconductor light emitting devices are well known to those having skill in the art and need not be described in detail herein.

For example, light emitting devices according to some embodiments of the present invention may include structures such as the gallium nitride-based LED and/or laser structures fabricated on a silicon carbide substrate, such as those devices manufactured and sold by Cree, Inc. of Durham, N.C. The present invention may be suitable for use with LED and/or laser structures that provide active regions such as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference in their entirety as if set forth fully herein. Other suitable LED and/or laser structures are described in published U.S. Patent Application Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Application Publication No. US 2002/0123164 A1 entitled Light Emitting Diodes Including Modifications for Light Extraction and Manufacturing Methods Therefor, the disclosures of which are hereby incorporated herein by reference in their entirety as if set forth fully herein. Furthermore, phosphor coated LEDs, such as those described in U.S. Patent Application Publication No. 2004/0056260, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in some embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Application Publication No. US 2002/0123164 A1. In addition, compounds of Formula I, according to some embodiments of the invention, may be useful in the LEDs described in U.S. Patent Application Publication No. 2008/0283864, filed May 16, 2007, entitled Single Crystal Light Conversion Structures For Light Emitting Devices, as cited above, and U.S. Patent Application Publication No. 2008/0121911 entitled Optical Preforms for Solid State Light Emitting Dice, and Methods and Systems for Fabricating and Assembling Same.

Figure 2:
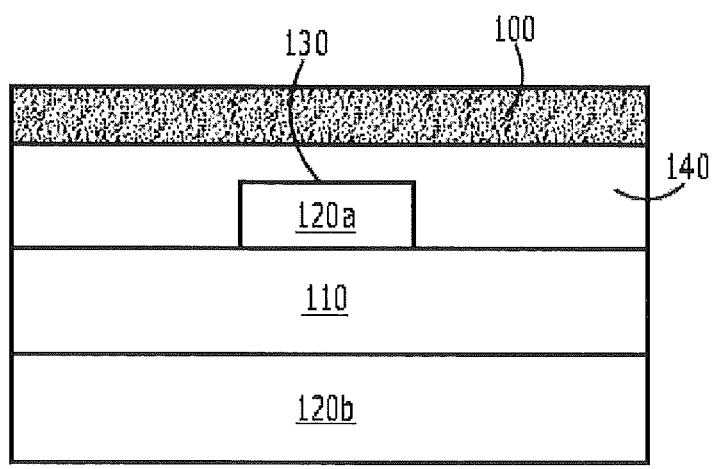
FIGS. 2, 3 and 4 illustrate light emitting devices that may include phosphor materials according to some embodiments of the invention.

FIG. 2 is a cross-sectional view of a solid state light emitting device according to some embodiments of the invention. As shown in FIG. 2, a preform 100, which may include the phosphor compound of Formula I, is configured to allow at least some light that is emitted from the solid state light emitting die 110 to pass therethrough. Stated differently, the preform is transparent to radiation from the solid state light emitting die 110. In some embodiments, the preform may be grown externally (e.g., via a Czochralksi-type method), optionally sized to fit the light emitting surface of the die, and then attached to the light emitting surface. The single crystal phosphor preform may be adhesively attached to the light emitting die in some embodiments. A layer 140, such as an adhesive layer, also may be provided on the preform 100 and/or on the die 110 that attaches, such as adhesively attaches, the preform 100 and the solid state light emitting die 110 to one another and also optically couples the preform 100 and the solid state light emitting die 110 to one another. In some embodiments, the phosphor compound of Formula I is present in the preform 100 as particles dispersed in a flexible or inflexible matrix. Other optical elements may be also provided according to other embodiments of the present invention, as will be described further below.

As described above, the preform 100 may comprise a flexible and/or inflexible material. An example of a flexible material is a silicone-based Room Temperature Vulcanizing (RTV) rubber material and/or a silicone-based polymer material that is widely available, for example from Dow Corning, Shin-Etsu, NuSil, GE and others. An example of an inflexible material is glass. The layer 140 may be transparent epoxy, such as a thermoset silicone gel or rubber, that is available from Dow Corning, Shin-Etsu, NuSil, GE and others, and/or any other transparent epoxy. In some embodiments, the preform may be the approximate size of a face of an LED die, for example about 1000 µm×1000 µm, and may have a thickness of between about 15 µm and about 75 µm. However, other dimensions may be provided in other embodiments.

As also shown in FIG. 2, the solid state light emitting die may include a contact pad, such as cathode 120a, and the preform 100, in some embodiments (not shown) may include a notch, hole and/or other void that is configured so as to expose the external contact pad C. However, as shown in FIG. 2, in some embodiments, a low profile wire bond 130 that does not pass through the preform 100 itself but, rather, passes through the layer 140 is used. In these embodiments, the wire 130 may be bonded to the anode 120b or cathode 120a, before placing the adhesive/coupling layer 140 and the preform 100 on the die 110. Low profile wire bonding embodiments may obviate the need for a cutout in the preform 100, which can make alignment of the preform easier during assembly.

Furthermore, according to some embodiments of the invention, the light emitting device includes a scattering layer applied to the surface of the preform. In some embodiments, the scattering layer includes ZnO, $TiO_2$, $Al_2O_3$, $SrO_2$ and/or $ZrO_2$. In addition, as one of skill in the art will understand, other elements used in LEDs, such as a reflector, an inert layer and/or an emissive layer, may be used in the light emitting devices according to embodiments of the invention.

Figure 3:
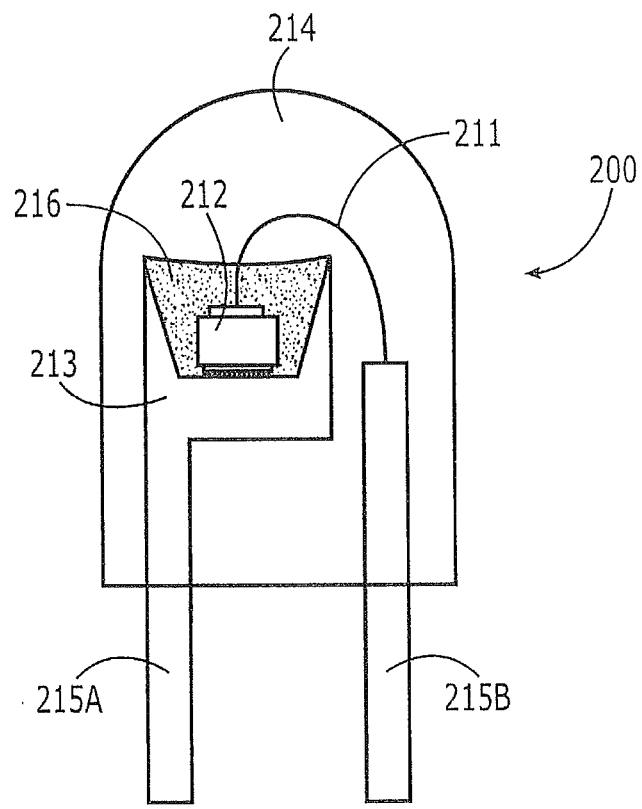

A packaged light emitting device 200 according to some embodiments is illustrated in FIG. 3. An LED package also includes electrical leads, contacts or traces for electrically connecting the LED package to an external circuit. In an LED package 200 as illustrated in FIG. 3, an LED chip 212 is mounted on a reflective cup 213 by means of a solder bond or conductive epoxy. One or more wirebonds 211 connect the ohmic contacts of the LED chip 212 to leads 215A and/or 215B, which may be attached to or integral with the reflective cup 213.

The reflective cup may be filled with an encapsulant material 216, such as an epoxy resin, containing a wavelength conversion material such as a phosphor, having the compound of Formula I. At least some of the light emitted by the LED (primary light) may be absorbed by the phosphor, which may responsively emit secondary light. The primary light emitted by the LED chip 212 and the secondary light emitted by the phosphor particles may combine to produce light having a plurality of wavelengths, and that may be perceived by an observer as having a different color than either the primary light or the secondary light.

The entire assembly may be encapsulated in a clear protective resin 214, which may be molded in the shape of a lens to collimate the light emitted from the LED chip 212 and/or phosphor particles in the encapsulant material 216.

Figure 4:
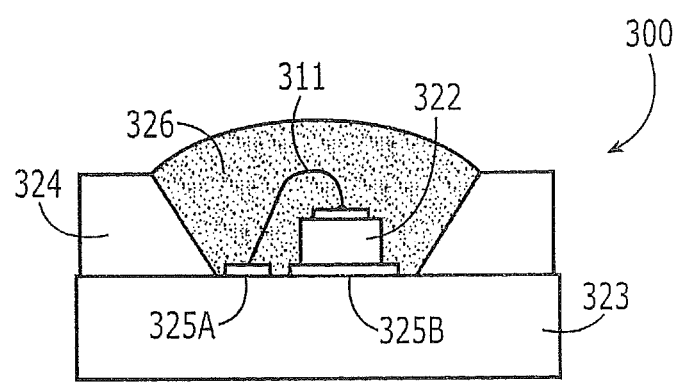

Another LED package 300 is illustrated in FIG. 4. The package of FIG. 4 may be more suited for high power operations which may generate more heat. In the LED package 300, one or more LED chips 322 are mounted onto a carrier such as a printed circuit board (PCB) carrier 323. A metal reflector 324 is mounted on the carrier 323 via an epoxy or solder bond. The metal reflector 324 surrounds the LED chip(s) 322 and reflects light emitted by the LED chips 322 away from the package 300. The reflector 324 also provides mechanical protection to the LED chips 322. One or more wirebond connections 311 are made between ohmic contacts on the LED chips 322 and electrical traces 325A, 325B on the carrier 323. The mounted LED chips 322 are then covered with an encapsulant 326, such as an epoxy resin and/or a silicone, which may provide environmental and mechanical protection to the chips while also acting as a lens. The encapsulant material 326 further includes a phosphor having the compound of Formula I for wavelength conversion.

Also according to some embodiments of the invention are light emitting devices that include a light emitting element configured to emit light at a wavelength in a range of about 380 nm to about 470 nm; a phosphor configured to absorb at least some of the light emitted from the light emitting element, wherein the phosphor emits light having a maximum emission wavelength in a range of about 500 to about 700 nm; wherein the FWHM of the light emitted from the phosphor is in a range of about 120 to about 200 nm. In some embodiments, the phosphor may be the compound of Formula I. In some embodiments, the phosphor may provide warm white light with a CRI greater than about 80 and have a conversion efficiency in a range of about 60% to about 100%. In addition, in some embodiments of the invention, warm white light with a CCT in a range of 2500 to about 4500 K may be provided.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device, comprising:
    a light emitting element configured to emit light at a wavelength in a range of about 380 nm to about 470 nm; and
    a phosphor configured to absorb at least some of the light emitted from the light emitting element, wherein the phosphor emits light having a maximum emission wavelength in a range of about 500 to about 700 nm;
    wherein the full width at half maximum of the light emitted from the phosphor is in a range of about 120 to about 200 nm; and
    wherein the phosphor comprises a compound having a $CaAlSiN_3$-type crystal structure that is co-doped with cerium and europium;
    wherein the phosphor comprises a single crystal phosphor preform attached to the light emitting element, the single crystal phosphor preform comprising a single crystal of a material having a compound of Formula I:

$$A_aB_bC_cD_dE_e \quad (I)$$

wherein A comprises one or more elements selected from the group consisting of Ca, Sr, Ba, Mg, Y, Hf, the lanthanide elements and the other alkaline earth metals;
B comprises Eu and Ce;
C comprises one or more tetrahedrally-coordinated trivalent elements;
D comprises one or more tetrahedrally-coordinated tetravalent elements;
E comprises one or more elements selected from the group consisting of N, O, F, C, S, Cl, Br and I, wherein a+b=1 and c+d=2, and e is in a range of 2.5 to 3.5.

2. The light emitting device of claim 1, wherein the conversion efficiency of the phosphor is in a range of about 60 to about 100%.

3. The light emitting device of claim 1, wherein a, b, c, and d satisfy the following requirements:
    a is in a range of 0.7 to 0.99;
    b is in a range of 0.01 to 0.3;
    c is in a range of 0.5 to 1.5;
    d is in a range of 0.5 to 1.5.

4. The light emitting device of claim 1, wherein b is in a range of 0.05 to 0.2.

5. The light emitting device of claim 1, wherein A comprises one or more of elements selected from the group consisting of Mg, Ba, Sr and Ca.

6. The light emitting device of claim 5, wherein A comprises Ca.

7. The light emitting device of claim 1, wherein C comprises one or more elements selected from the group consisting of Al, B, Ga, P, In, Sc, Y, Gd, and Lu.

8. The light emitting device of claim 7, wherein C comprises Al.

9. The light emitting device of claim 1, wherein D comprises one or more elements selected from the group consisting of Si, Ge, Sn, Ti, Zr and Hf.

10. The light emitting device of claim 9, wherein D comprises Si.

11. The light emitting device of claim 1, wherein E comprises N, C, S, Cl, Br, I and/or F.

12. The light emitting device of claim 11, wherein E comprises N.

13. The light emitting device of claim 1, wherein A comprises Sr and Ca, wherein $\chi(Sr)+\chi(Ca)=1$.

14. The light emitting device of claim 1, wherein C comprises Al and D comprises Si, wherein $c+d=2$.

15. The light emitting device of Claim 1, wherein E comprises O and N, and $\chi(O)+\chi(N)=3$.

16. The light emitting device of claim 1, wherein cerium and europium are together present in the compound at concentration in a range of about 0.1% to about 20% by weight.

17. The light emitting device of claim 1, wherein the maximum emission wavelength of the phosphor occurs when the phosphor is irradiated with radiation in a range of about 380 nm to about 480 nm.

18. The light emitting device of claim 17, wherein the full width at half maximum is less than about 200 nm.

19. The light emitting device of claim 10, further comprising an adhesion layer between the phosphor preform and the light emitting element.

* * * * *